US008565271B2

(12) United States Patent
Khatana et al.

(10) Patent No.: US 8,565,271 B2
(45) Date of Patent: Oct. 22, 2013

(54) MULTIPLEXER LANE ALIGNMENT FOR HIGH-SPEED DATA SYSTEMS

(75) Inventors: Sunil Kumar Singh Khatana, Sunnyvale, CA (US); Hong Jiang, Saratoga, CA (US)

(73) Assignee: Opnext Subsystems, Inc., San Jose, CA (US)

( * ) Notice: Subject to any disclaimer, the term of this patent is extended or adjusted under 35 U.S.C. 154(b) by 315 days.

(21) Appl. No.: 13/078,825

(22) Filed: Apr. 1, 2011

(65) Prior Publication Data

US 2012/0251099 A1 Oct. 4, 2012

(51) Int. Cl.
*H04J 3/04* (2006.01)

(52) U.S. Cl.
USPC .......................................... 370/535; 370/537

(58) Field of Classification Search
USPC ......... 370/503, 508, 509, 510, 511, 512, 513, 370/514, 535, 536, 241
See application file for complete search history.

(56) References Cited

U.S. PATENT DOCUMENTS

| | | | | |
|---|---|---|---|---|
| 8,358,726 | B2 * | 1/2013 | Hu et al. | 375/354 |
| 2002/0150127 | A1 * | 10/2002 | Heinen et al. | 370/503 |
| 2009/0100314 | A1 * | 4/2009 | Danninger et al. | 714/755 |
| 2009/0129455 | A1 | 5/2009 | Kim et al. | |

FOREIGN PATENT DOCUMENTS

EP 1276260 A2 1/2003

OTHER PUBLICATIONS

International Search Report/Written Opinion in International Application No. PCT/US2012/031150, mailed Jul. 20, 2012, 9 pages.

* cited by examiner

*Primary Examiner* — Chuong T Ho
(74) *Attorney, Agent, or Firm* — Fenwick & West LLP

(57) ABSTRACT

Patterns detected by a low-speed receiver at the output of a high-speed multiplexer are used to determine when multiplexer input lanes are deskewed.

16 Claims, 9 Drawing Sheets

MUX input data (e.g. 8 Gb/s): 410

Lane 1: | 1 | 0 | 0 | 1 | 1 | ....
Lane 2: | 1 | 0 | 0 | 1 | 1 | ....
Lane 3: | 1 | 0 | 0 | 1 | 1 | ....
Lane 4: | 1 | 0 | 0 | 1 | 1 | ....

→ t ←

MUX output data (e.g. 32 Gb/s):

MUX input data:

Lane 1: | A | E | I | M | Q | ....
Lane 2: | B | F | J | N | R | ....     610
Lane 3: | C | G | K | O | S | ....
Lane 4: | D | H | L | P | T | ....

→ t ←

MUX output data:

→ 4·(t/4) ←      620

| A B C D | E F G H | I J K L | M N O P | Q R S T | ....

MUX input data:

| Lane 1: | | A | E | I | M | .... |
| Lane 2: | B | F | J | N | R | .... |
| Lane 3: | C | G | K | O | S | .... |
| Lane 4: | D | H | L | P | T | .... |

→ t ←

630

MUX output data:

640

→ 4·(t/4) ←

| B C D A | F G H E | J K L I | N O P M | R S T | .... | wrong order, correct data

MUX input data:

Lane 1:       A  E  I  M  ....         650
Lane 2:       B  F  J  N  ....
Lane 3:  C  G  K  O  S  ....
Lane 4:  D  H  L  P  T  ....
              → t ←

MUX output data:              660
            → 4·(t/4) ←

| C D A B | G H E F | K L I J | O P M N | .... |
         ↑
         wrong order, correct data MUX input data:

| | | | | | |
|---|---|---|---|---|---|
| Lane 1: | | X | A | E | I | .... |
| Lane 2: | B | F | J | N | R | .... |
| Lane 3: | C | G | K | O | S | .... |
| Lane 4: | D | H | L | P | T | .... |

670

→ t ←

MUX output data:

680

→ 4·(t/4) ←

| B C D X | F G H A | J K L E | N O P I | R S T | .... |

↑ wrong data

MULTIPLEXER LANE ALIGNMENT FOR HIGH-SPEED DATA SYSTEMS

TECHNICAL FIELD

The disclosure is generally related to high-speed data systems and in particular to alignment of multiplexer (MUX) input lanes.

BACKGROUND

Next-generation fiber-optic communications links are being designed to operate at speeds as high as 40 or even 100 gigabits per second. Low-speed digital electronic data streams or "lanes" are combined into a high-speed data stream which is sent to an optical modulator to take advantage of the extremely high data rates that are possible with fiber optics.

Low-speed lanes originating from field programmable gate arrays (FPGA) or application specific integrated circuits (ASIC) often have unknown delays between lanes. These delays can change over a power cycle or when a chip's clock is reset. The delays must be removed ("deskewed") for proper operation of a high-speed data system. Skew between low-speed lanes in a serializer/deserializer (SERDES) leads to incorrect ordering of data in the output of a multiplexer, for example.

Thus what are needed are systems and methods to resolve skew in low-speed lanes at the input to a MUX as easily as possible.

DETAILED DESCRIPTION

The system for multiplexer lane alignment described below can use a low-speed data receiver to detect patterns at the output of a high-speed multiplexer. Microfabrication technology used to make high-speed chips is different and more expensive than that used in low-speed chips. Thus there is an incentive to keep high-speed chips as simple as possible. In the case of a multiplexer this includes avoiding on-board deskewing circuits.

The system described below uses a low-speed (e.g. 8 Gb/s) receiver to observe a high-speed (e.g. 32 Gb/s) multiplexer output. At first, this seems like an unlikely basis for a solution as low-speed receivers are normally befuddled by high-speed signals. Given arbitrary data, a low-speed receiver will not even sync to a high-speed data stream. But when an N-way multiplexer combines N lanes of identical data (i.e., same bit pattern and same rate per each of the N lanes), its high-speed output looks the same (i.e., has the same bit pattern) as any one of the lanes of input data at the low-speed input data rate if the input lanes are aligned. This principle, which is explained in detail below, forms the basis for systems and methods for aligning low-speed lanes without increasing the complexity of high-speed multiplexers.

Figure 1:
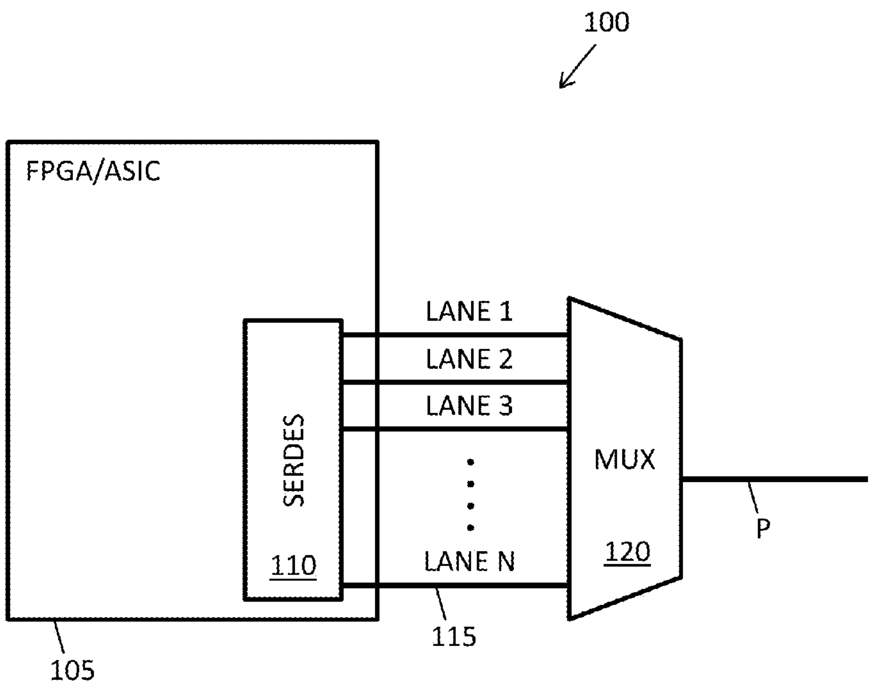
FIG. 1 shows a schematic block diagram of a data transmitter connected to a MUX.

FIG. 1 shows a schematic block diagram of a portion of a data transmitter 100 including a MUX 120. Serializer/deserializer (SERDES) 110 provides N lanes of data output from FPGA/ASIC 105. These lanes, LANE 1, LANE 2, . . . , up to LANE N (115), are input to multiplexer 120. The many other functional blocks that may be present in FPGA/ASIC 105 are omitted for clarity. MUX 120 combines data from its input lanes into one output, P.

Figure 2:
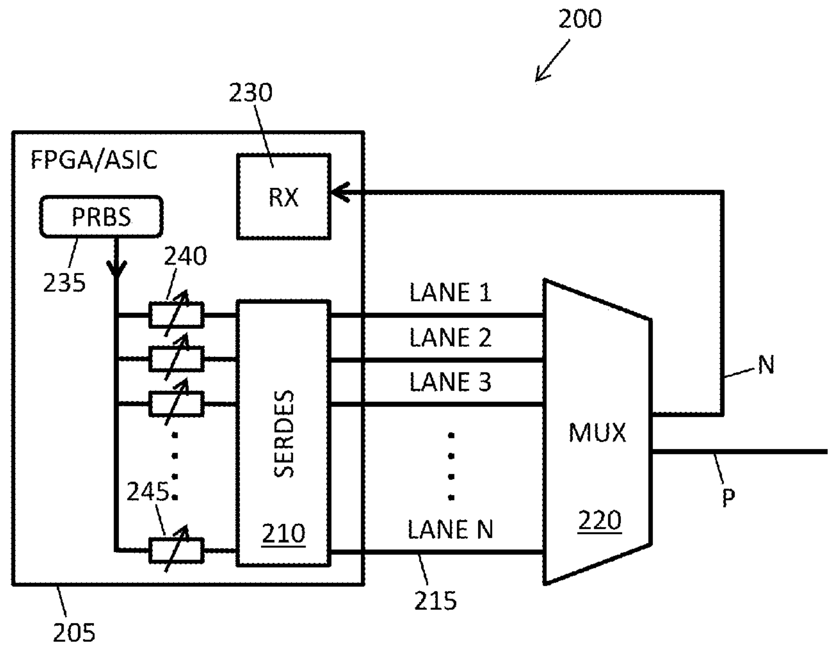
FIG. 2 shows a schematic block diagram of a data transmitter with a MUX lane alignment system.

FIG. 2 shows a schematic block diagram of a portion of a data transmitter 200 including a MUX lane alignment system. Similarly to the system of FIG. 1, serializer/deserializer (SERDES) 210 provides N lanes of data output from FPGA/ASIC 205. These lanes, LANE 1, LANE 2, . . . , up to LANE N (215), are input to multiplexer 220. MUX 120 combines data from its input lanes into output, P, and complementary output, N. (A splitter may be used instead of P and N outputs, if desired.)

Output N is connected to a low-speed receiver 230. Receiver 230 is illustrated as being part of FPGA/ASIC 205, which is a typical implementation, but not required; the receiver could be located on another chip. Here, "low-speed" means the speed of the SERDES lane outputs. It is slow compared to the outputs (N or P) of the multiplexer.

Pseudo-random bit stream 235 is a source of pseudo-random data that is sent to SERDES 210 via variable delays or data phase adjusters such as delays 240 and 245. The delays provide a way to adjust the skew between data streams output as lanes 1, 2, . . . , N from the SERDES. Thus PRBS 235 and receiver 230 provide a source of test data and a mechanism for detecting it, respectively. Delays (e.g. 240, 245) are adjusted to eliminate skew using test data and their settings are retained when actual data is present. The many other functional blocks that may be present in FPGA/ASIC 205 are omitted for clarity.

Figure 3:
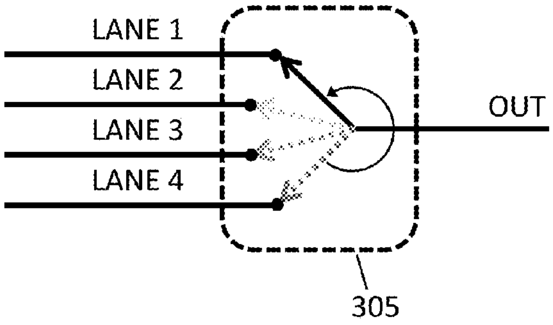
FIG. 3 illustrates MUX operation conceptually.

Conceptual operation of a multiplexer (e.g. MUX 220) is illustrated in FIG. 3. A multiplexer may be thought of as a rotating switch 305. The multiplexer temporarily connects its output to one of its inputs, e.g. LANE 1. Then, after a short time, the multiplexer disconnects LANE 1 from the output and connects LANE 2 to the output instead. After that LANE 3 is connected and finally LANE 4. The multiplexer spends enough time on each input to sample the input data, but it cycles through all inputs fast enough that no input data is lost. If there are N inputs, each supplying data at rate R, then the output data rate is N times R.

One of the goals of lane alignment is to adjust lane skew such that the multiplexer samples each input at the optimum time, normally in the middle of each incoming data bit. The multiplexer samples its inputs in consistent, sequential order, but it may start at any input after a power cycle, clock reset or other disruption. Thus, another goal of lane alignment is to figure out at which lane a multiplexer most recently started. Although FIG. 3 and examples below show a 4:1 MUX, the principles involved are applicable to a MUX of arbitrary input/output dimensions.

Figure 4:
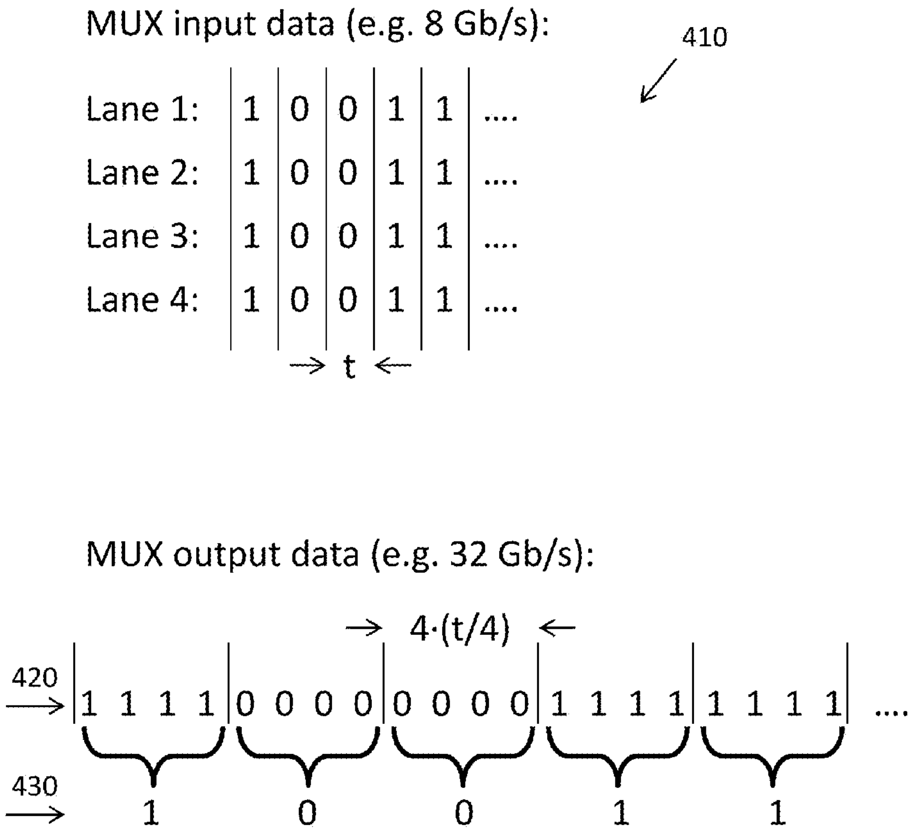
FIG. 4 illustrates a lane alignment example.

FIG. 4 shows an example of using a low-speed receiver to align a high-speed multiplexer. For instance, FIG. 4 shows data 410, 420 in various time slots at the inputs and output of a MUX, respectively. For example, the data on Lane 1 is: 10011. Similarly the data on Lanes 2, 3 and 4 is also: 10011. The data 410 on all input lanes is the same. Time slots for data 410 in the input lanes have duration "t"; if the input data rate is 8 Gb/s, then "t" is about 125 ps.

Suppose that the four input data lanes of FIG. 4 are input to the MUX of FIG. 3 and that the MUX starts at Lane 1. The MUX samples the data 410 at the input lanes, in order, 1 from Lane 1

1 from Lane 2
1 from Lane 3
1 from Lane 4
0 from Lane 1
0 from Lane 2
et cetera.

The result is shown as the following data 420 at the MUX output:

111100 et cetera.

Since there are N=4 input lanes and one output, the multiplexer output data rate is four times the input data rate. If the input rate is 8 Gb/s, then the output rate is 32 Gb/s and the duration of an output time slot is about 31.25 ps. However, since each of the N input lanes carries the same data 410, the output data 420 changes at most once every N bits. Thus, output data 420,

11110000000011111111, sent at 32 Gb/s is detected as probe data 430,

10011, by an 8 Gb/s receiver.

The lanes in the example of FIG. 4 are aligned. In general, however, the lanes are not aligned and the relative delay between lanes must be adjusted until a combination of unit interval delays is found for which the low speed receiver syncs (i.e. effectively recovers clock timing from) the high speed signal.

After the slow (i.e. 8 Gb/s in this example) receiver syncs, it interprets 0000 sent at 32 Gb/s as 0 and 1111 sent at 32 Gb/s as 1. However, the slow receiver usually samples its input near the middle of an 8 Gb/s unit time interval. Thus, the slow receiver may also interpret 0001 (or 1000 or 1001) as 0 because it is not sensitive to disturbances near the beginning or end of a unit time interval. This potential problem is removed by systematically trying different lane delay combinations and sweeping the phase of the slow receiver while measuring bit-error rate.

Figure 5:
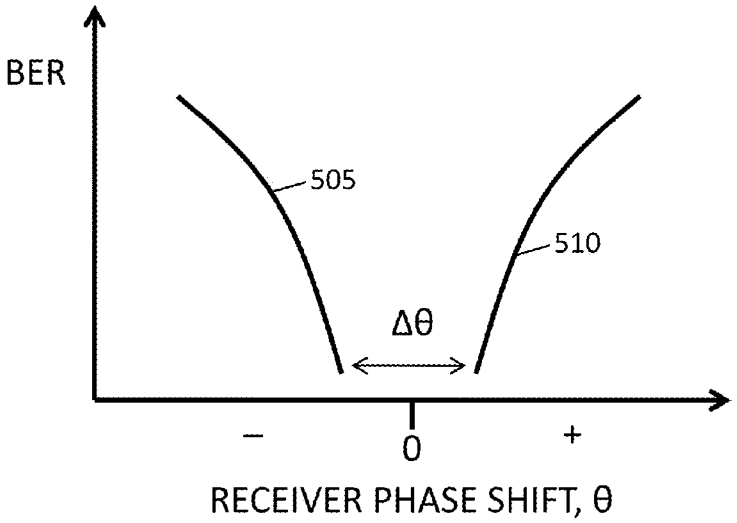
FIG. 5 illustrates a measurement of bit error rate versus receiver phase.

FIG. 5 illustrates a measurement of bit-error rate versus receiver phase. Curves such as 505 and 510 show bit error rate at a low-speed receiver (e.g. RX 230 in FIG. 2) as a function of receiver phase shift $\theta$. The range of receiver phase shifts, $\Delta\theta$, over which a minimum bit-error rate occurs reveals whether or not 0 as measured by the slow speed receiver corresponds to high-speed 0000 instead of 0001 or 1000 or 1001. Different lane delay combinations, adjusted in unit interval increments, are tested by programming variable delays or phase adjusters (such as delays 240 and 245 in FIG. 2). The combination that yields the maximum $\Delta\theta$ corresponds to the greatest receiver eye opening; i.e. the condition in which 0 measured by the slow receiver corresponds to 0000 high-speed input only.

As mentioned above, after a reset the MUX may start at any lane. Thus a way to find out which input was sampled first after the most recent reset is needed. Suppose the MUX starts on Lane W. If Lane W is delayed by one bit, data at the high-speed output of the MUX is rearranged within an N-bit output block—a change that is not detectable by a low-speed receiver. If, on the other hand, a different (i.e. not the one at which the MUX started) lane, e.g. Lane X, is delayed by one bit, then data is rearranged across an N-bit output block, leading to an impaired eye diagram detected by a low-speed receiver. Thus the lane at which the MUX started is the one that can be delayed by one bit without affecting the data received by a low-speed receiver monitoring a high-speed MUX output. Other alignment examples are shown in FIGS. 6A-6D. In these other examples, N=4.

FIGS. 6A-6D show binary data having bits labeled by letters (A, B, C, . . . etc.) rather than “0” or “1”. The lettered-bit labels merely aid in keeping track of the identity of bits. Said another way, the letters keep track of time slots.

Figure 6A:
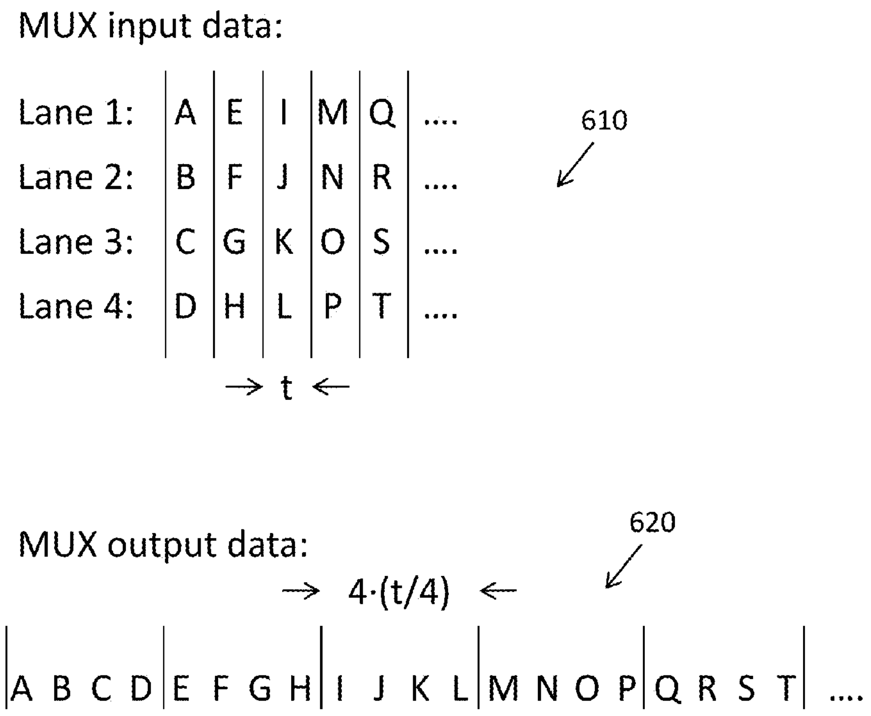
FIGS. 6A-6D illustrate other lane alignment examples.

FIG. 6A shows data 610, 620 in various time slots at the inputs and output of a MUX. In FIG. 6A, time slots AEIMQ of Lane 1 are aligned with time slots
BFJNR of Lane 2,
CGKOS of Lane 3, and
DHLPT of Lane 4.

Despite the different labeling of time slots, the data 610 on all input lanes is the same. Thus if the data in slots AEIMQ is 01, then the data in slots CGKOS, for example, is also 01001. The duration of each slot is t.

Suppose that the four input data lanes of FIG. 6A are input to the MUX of FIG. 3 and that the MUX starts at Lane 1. The MUX samples the data 610 at the input lanes, in order:

slot A from Lane 1
slot B from Lane 2
slot C from Lane 3
slot D from Lane 4
slot E from Lane 1
slot F from Lane 2
et cetera.

The result is shown as the following data 620 at the MUX output in FIG. 6A:

ABCDEF et cetera.

Figure 6B:
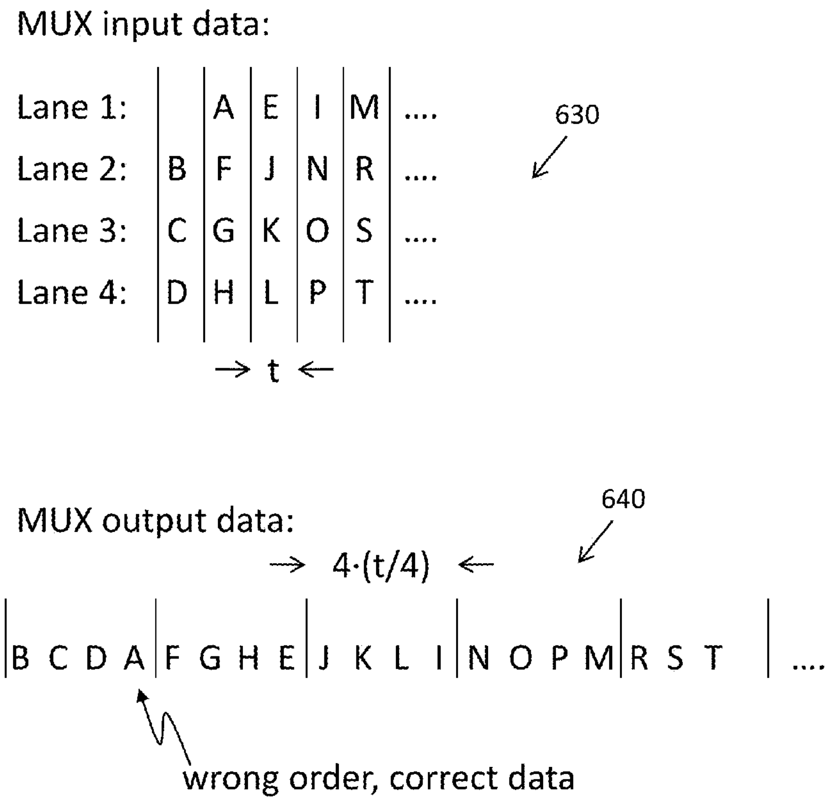

FIG. 6B shows what happens if Lane 1 is delayed by one bit. The MUX samples the data 630 at the input lanes, in order:

slot B from Lane 2
slot C from Lane 3
slot D from Lane 4
slot A from Lane 1
slot F from Lane 2
slot G from Lane 3
et cetera.

The result is shown as the following data 640 at the MUX output in FIG. 6B:

BCDAFG et cetera.

The first N (N=4) bits of output have been rearranged as “BCDA” instead of “ABCD”. But since this rearrangement occurs within an N-bit block it is not detectable by a low-speed receiver. A, B, C and D either are all “0” or all “1”. FIGS. 6A and 6B show that if the MUX starts on Lane 1, then delaying Lane 1 from its properly aligned configuration changes the MUX output in a way that cannot be detected by a low-speed receiver.

Figure 6C:
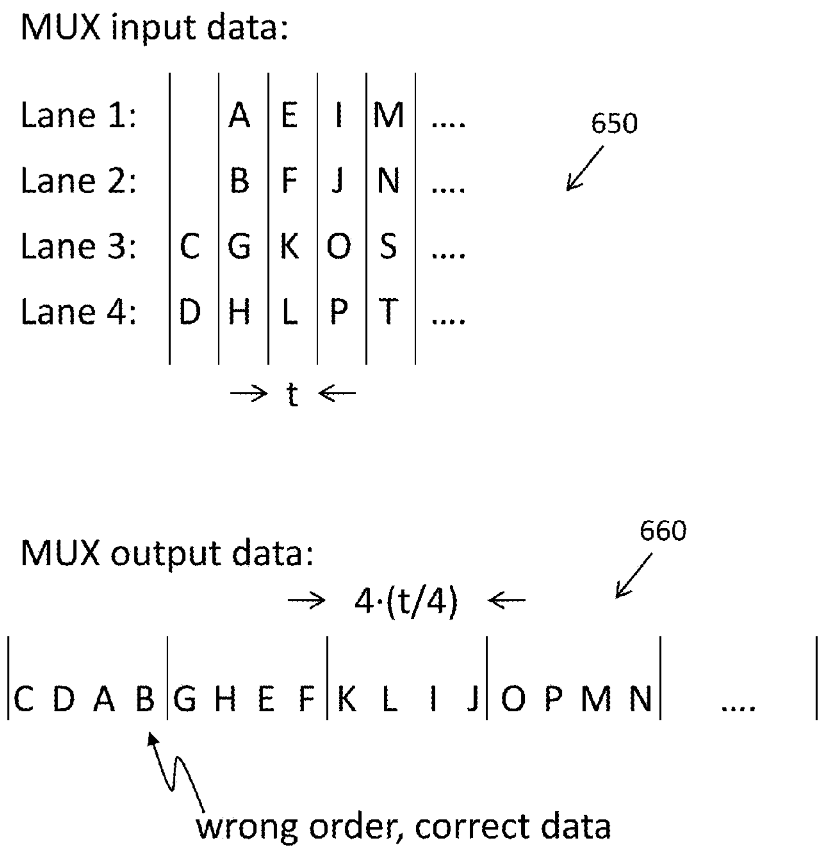
Figure 6D:
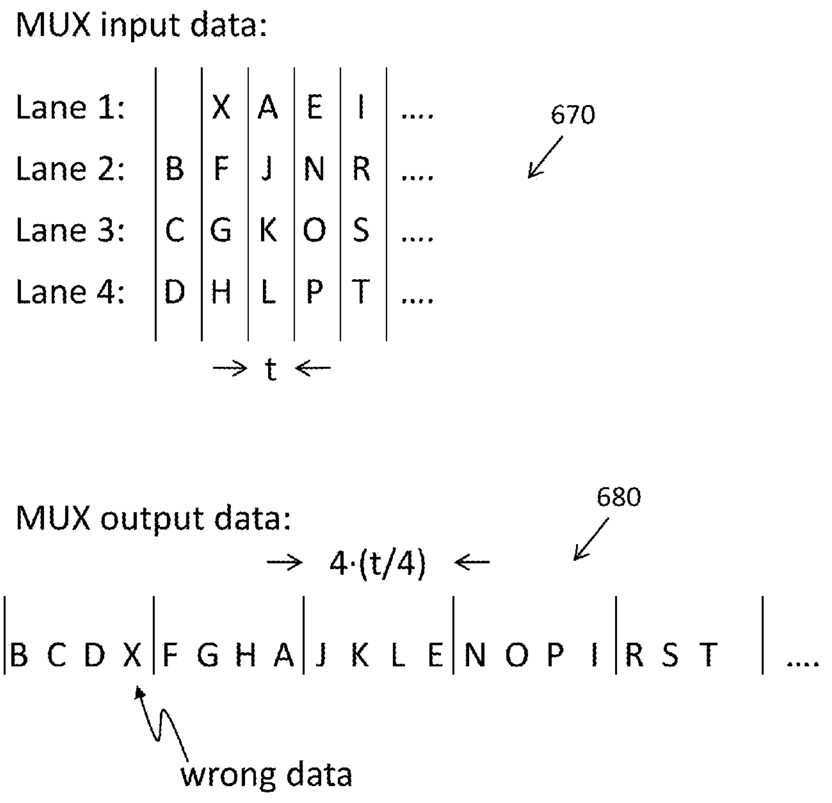

FIG. 6B may also equivalently be interpreted as the situation obtained when the MUX starts at Lane 2. Taking this view, FIG. 6C shows what happens if Lane 2 (of FIG. 6B) is delayed by one unit, and FIG. 6D shows what happens if Lane 1 (of FIG. 6B) is delayed by one unit. Based on the discussion above one might expect, and we shall see (in FIG. 6C) that it is indeed the case that, when starting Lane 2 is delayed by one unit, data bits 660 in the high-speed output of the MUX are rearranged within N-bit blocks, causing no detectable change in a low-speed receiver. But when non-starting Lane 1 is delayed by one unit (see FIG. 6D), data bits 680 in the high-speed output of the MUX are rearranged across N-bit blocks, impairing the eye diagram in a low-speed receiver.

Turning now to FIG. 6C, the MUX samples the data 650 at the input lanes, in order:

slot C from Lane 3
slot D from Lane 4
slot A from Lane 1
slot B from Lane 2
slot G from Lane 3
slot H from Lane 4 et cetera.

The result is shown as the following data 660 at the MUX output in FIG. 6C:

CDABGH et cetera.

The first N (N=4) bits of output have been rearranged as "CDAB" instead of "BCDA". But since this rearrangement occurs within an N-bit block it is not detectable by a low-speed receiver.

Finally in FIG. 6D, the MUX samples the data 670 at the input lanes, in order:

slot B from Lane 2
slot C from Lane 3
slot D from Lane 4
slot X from Lane 1
slot F from Lane 2
slot G from Lane 3
et cetera.

The result is shown as the following data 680 at the MUX output in FIG. 6D:

BCDXFG et cetera.

The first N (N=4) bits of output have been rearranged as "BCDX" instead of "BCDA". "X" is a wrong bit; it is not necessarily the same as B, C or D. Inspection of FIG. 6D reveals that other bits in the high speed output have been rearranged across N-bit blocks. These changes are detectable by a low-speed receiver as eye diagram impairments. There are two, equivalent ways to view the situation of FIG. 6D: (1) MUX started at Lane 2 (FIG. 6C), but a different lane, Lane 1 in this case, has been delayed by one t unit; or (2) MUX started at Lane 1 (FIG. 6A), but Lane 1 has been delayed by two t units.

Once the lane at which the MUX started is known, adjustments to the lane delays may be made to put the data output by the MUX in the correct order. For example, FIG. 6B shows a situation when the MUX starts at Lane 2. In this case Lane 1 must be advanced by one t unit (or, equivalently, Lanes 2, 3 and 4 must be delayed by one t unit each) to return to the desired data ordering of FIG. 6A.

As another example, FIG. 6C shows a situation when the MUX starts at Lane 3. In this case Lanes 1 and 2 must be advanced by one t unit each (or, equivalently, Lanes 3 and 4 must be delayed by one t unit each) to return to the desired data ordering of FIG. 6A. In general, if there are N lanes and the MUX starts on Lane M, then Lanes 1 through (M−1) must be advanced by one t unit each (or, equivalently, Lanes M through N must be delayed by one t unit each) to achieve the desired data ordering.

Thus to align (deskew) and determine ordering of lanes in an N:1 MUX, the following procedure can be employed. First, copies of a data stream are provided to each input lane (e.g., PRBS 235.) Next, the output of the MUX is received with a low-speed data receiver (e.g., 230) running at the input lane rate. Further, combinations of unit time slot lane delays are stepped through until the receiver (e.g., 230) achieves sync. In response to the sync achieved by the receiver, fine skew adjustments are made to maximize the $\Delta\theta$ opening in a graph of bit error rate versus receiver phase $\theta$. (Equivalently, fine skew adjustments are made to optimize the opening of the receiver eye diagram.) A lane M which is first in the MUX sequence is determined next by finding that Lane M can be delayed by one time slot without affecting the eye diagram at the low-speed receiver. Finally, Lanes 1 through (M−1) are advanced by one t-unit each (or, equivalently, Lanes M through N are delayed by one t-unit each to achieve the desired data ordering.

The procedure may be performed whenever a pseudo random bit stream is available for input to all lanes of a MUX simultaneously, some means for adjusting the skew between lanes exists, and a low-speed receiver is used to observe the high-speed MUX output. For example, the methods described in this specification may be performed automatically after power cycles, clock resets or other disturbances, or they may be performed periodically. (For periodic operation, a disturbance that triggers multiplexer lane alignment methods may be the expiration of a predetermined time period.) An automated system for multiplexer lane alignment can be implemented as electronic circuitry communicatively coupled with (i) the SERDES 210 circuit or the input of the MUX 220, and (ii) with the output of the MUX 220. For the example transmitter system 200 illustrated in FIG. 2, the PRBS 235, control and interface circuits for adjustable delays 240 and 245, and receiver 230 may be included in one or more ASICs. In this manner, such ASICs can be used to automatically align the input lanes of MUX 220 in some repeated fashion.

The techniques described in this document can be implemented using an apparatus, a method, a system, or any combination of an apparatus, methods, and systems. Implementations of the subject matter and the operations described in this document can be configured in digital electronic circuitry, or in computer software, firmware, or hardware, including the structures disclosed in this document and their structural equivalents, or in combinations of one or more of them. For a hardware implementation, the embodiments (or modules thereof) can be implemented within one or more application specific integrated circuits (ASICs), mixed signal circuits, digital signal processors (DSPs), digital signal processing devices (DSPDs), programmable logic devices (PLDs), field programmable gate arrays (FPGAs), processors, controllers, micro-controllers, microprocessors and/or other electronic units designed to perform the functions described herein, or a combination thereof.

When the embodiments are implemented in software, firmware, middleware or microcode, program code or code segments, they can be stored in a machine-readable medium (or a computer-readable medium), such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents.

While this document contains many specific implementation details, these should not be construed as limitations on the scope of any inventions or of what may be claimed, but rather as descriptions of features specific to particular implementations of particular inventions. Certain features that are described in this document in the context of separate implementations can also be configured in combination in a single implementation. Conversely, various features that are described in the context of a single implementation can also be configured in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The above description of the disclosed implementations is provided to enable any person skilled in the art to make or use the disclosure. Various modifications to these implementations will be readily apparent to those skilled in the art, and the principles defined herein may be applied to other implementations without departing from the scope of the disclosure. Thus, the disclosure is not intended to be limited to the implementations shown herein but is to be accorded the widest scope consistent with the principles and novel features disclosed herein.

What is claimed is:

1. A method for aligning lanes of a multiplexer, the method comprising:

providing digital data streams to each of N input lanes of the multiplexer, each of the digital data streams having a data rate R and being a copy of a pseudo-random bit stream;

receiving multiplexer output at a data receiver running at a rate less than N times R;

adjusting relative delays between the data streams in units of (1/R) until the data receiver is synchronized with the multiplexer output; and measuring bit-error rate of the data receiver versus receiver phase for multiple combinations of relative delays between the provided data streams for which the data receiver achieves sync with the multiplexer output; and determining a combination of relative delays from among the multiple combinations of relative delays between the provided data streams that yields the greatest range of receiver phase over which the bit error rate is maintained at less than a predetermined level.

2. The method of claim 1, wherein the data receiver runs at rate R.

3. The method of claim 1 further comprising:

delaying each of the data streams at the inputs of the multiplexer in sequence by one unit of (1/R); and determining an input M of the multiplexer that can be delayed by one unit of (1/R) without affecting an eye opening monitored at the data receiver when it is synced with the multiplexer output; and advancing data inputs 1 through (M−1) by one unit of (1/R) each.

4. The method of claim 1, wherein N is larger than or equal to 4 and R is greater than or equal to 8 Gb/s.

5. A system comprising:

a multiplexer including N input lanes, each input lane communicatively coupled with a variable data delay, and an output configured to operate at data rate N times R;

a receiver including an input connected to the output of the multiplexer, the receiver configured to operate at data rate R;

a pseudo-random bit stream generator communicatively coupled with the N variable data delays simultaneously; and a controller configured to operate the receiver, the pseudo-random bit stream generator and the N variable data delays to align the N input lanes of the multiplexer, wherein to align the N input lanes of the multiplexer the controller is further configured to:

measure bit-error rate of the receiver versus receiver phase for multiple combinations of relative delays between the pseudo-random bit streams provided by the generator to the N input lanes of the multiplexer for which the data receiver achieves sync with the multiplexer output, and determine a combination of relative delays from among the multiple combinations of relative delays between the provided pseudo-random bit streams that yields the greatest range of receiver phase over which the bit error rate is maintained at less than a predetermined level.

6. The system of claim 5, wherein the receiver and pseudo-random bit stream generator are implemented in an integrated circuit chip.

7. The system of claim 6, wherein the controller is also implemented in the integrated circuit chip.

8. The system of claim 5, wherein the variable data delays are configured to delay data in units of (1/R).

9. The system of claim 5, wherein, to align the N input lanes of the multiplexer, the controller is also configured to:

delay each of the pseudo-random bit streams at the N input lanes of the multiplexer in sequence by one unit of (1/R);

determine an input lane M of the multiplexer that can be delayed by one unit of (1/R) without affecting an eye opening monitored at the receiver when it is synced with the multiplexer output; and advance input lanes 1 through (M−1) by one unit of (1/R) each.

10. The system of claim 5, wherein N is larger than or equal to 4, and R is greater than or equal to 8 Gb/s.

11. A system comprising:

N variable data delays communicatively coupled with respective N input lanes of a multiplexer;

a pseudo-random bit stream generator simultaneously coupled with the N variable data delays and configured to provide a signal having data rate R to the N input lanes of the multiplexer through the N simultaneously connected variable data delays;

a receiver communicatively coupled with an output of the multiplexer, wherein the receiver is configured to:

receive from the multiplexer another signal including N multiplexed copies of the signal provided to the N input lanes of the multiplexer, the other signal having data rate N times R, and operate at data rate R on the received other signal having the data rate N times R; and a controller configured to operate the receiver, the pseudo-random bit stream generator and the N variable data delays to align the N input lanes of the multiplexer, wherein to align the N input lanes of the multiplexer, the controller is further configured to:

measure bit-error rate of the receiver versus receiver phase for multiple combinations of relative delays between the pseudo-random bit streams provided by the generator to the N input lanes of the multiplexer for which the data receiver achieves sync with the multiplexer output, and determine a combination of relative delays from among the multiple combinations of relative delays between the provided pseudo-random bit streams that yields the greatest range of receiver phase over which the bit error rate is maintained at less than a predetermined level.

12. The system of claim 11, wherein, to align the N input lanes of the multiplexer, the controller is also configured to:

delay each of the pseudo-random bit streams at the N input lanes of the multiplexer in sequence by one unit of (1/R), determine an input lane M of the multiplexer that can be delayed by one unit of (1/R) without affecting an eye opening monitored at the receiver when it is synced with the multiplexer output, and advance input lanes 1 through (M−1) by one unit of (1/R) each.

13. The system of claim 11, wherein the receiver and pseudo-random bit stream generator are included on an integrated circuit chip.

14. The system of claim 13, wherein the controller is also included on the IC chip.

15. The system of claim 11, wherein the variable data delays are configured to delay data in units of (1/R).

16. The system of claim 11, wherein N is larger than or equal to 4, and R is greater than or equal to 8 Gb/s.

* * * * *